(12) United States Patent
Ishimura

(10) Patent No.: US 9,601,507 B2
(45) Date of Patent: Mar. 21, 2017

(54) SEMICONDUCTOR DEVICE AND METHOD OF MANUFACTURING SEMICONDUCTOR DEVICE

(71) Applicant: Kabushiki Kaisha Toshiba, Minato-ku (JP)

(72) Inventor: Munio Ishimura, Suzuka (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/800,948

(22) Filed: Jul. 16, 2015

(65) Prior Publication Data

US 2016/0276262 A1 Sep. 22, 2016

(30) Foreign Application Priority Data

Mar. 17, 2015 (JP) ................................. 2015-052932

(51) Int. Cl.
| | | |
|---|---|---|
| H01L 23/48 | (2006.01) | |
| H01L 27/115 | (2006.01) | |
| H01L 23/522 | (2006.01) | |
| H01L 21/768 | (2006.01) | |
| H01L 21/3205 | (2006.01) | |
| H01L 21/3213 | (2006.01) | |

(52) U.S. Cl.
CPC .. *H01L 27/11582* (2013.01); *H01L 21/32055* (2013.01); *H01L 21/32139* (2013.01); *H01L 21/76805* (2013.01); *H01L 23/5226* (2013.01)

(58) Field of Classification Search
CPC ............... H01L 23/528; H01L 23/5329; H01L 23/5226; H01L 23/32055; H01L 23/32139; H01L 21/76804; H01L 21/76805

USPC .................................................. 257/758, 774
See application file for complete search history.

(56) References Cited

U.S. PATENT DOCUMENTS

| | | | | |
|---|---|---|---|---|
| 6,191,444 B1* | 2/2001 | Clampitt | ........... | H01L 27/11521 257/288 |
| 6,207,579 B1* | 3/2001 | Chen | ................. | H01L 21/76877 257/E21.021 |
| 6,255,205 B1* | 7/2001 | Sung | ..................... | H01L 27/115 257/E21.682 |
| 6,649,508 B1* | 11/2003 | Park | .................. | H01L 21/76897 257/68 |
| 7,781,332 B2* | 8/2010 | Arnold | .............. | H01L 21/76808 257/758 |
| 2003/0186526 A1* | 10/2003 | Chang | ............... | H01L 21/76831 438/600 |
| 2004/0075132 A1* | 4/2004 | Lee | .................... | H01L 21/76831 257/309 |

(Continued)

FOREIGN PATENT DOCUMENTS

| | | |
|---|---|---|
| JP | 8-153795 | 6/1996 |
| JP | 2007-96214 | 4/2007 |
| JP | 2011-44599 | 3/2011 |

*Primary Examiner* — Nitin Parekh
(74) *Attorney, Agent, or Firm* — Oblon, McClelland, Maier & Neustadt, L.L.P.

(57) ABSTRACT

According to one embodiment, a semiconductor device includes an insulating layer provided on a semiconductor substrate, an opening provided on the insulating layer, a spacer film provided in a side wall of the opening in a stepped shape, and configured to have an etching resistance lower than that of the insulating layer, and a conductive body provided in the opening to be configured to cover the spacer film.

15 Claims, 8 Drawing Sheets

(56) References Cited

U.S. PATENT DOCUMENTS

| | | | |
|---|---|---|---|
| 2005/0012218 A1* | 1/2005 | Kuan | H01L 21/76804 257/758 |
| 2007/0077774 A1 | 4/2007 | Yoshida | |
| 2007/0155150 A1* | 7/2007 | Kim | H01L 21/76831 438/597 |
| 2009/0072211 A1* | 3/2009 | Lee | H01L 45/04 257/2 |
| 2015/0028494 A1* | 1/2015 | Park | H01L 23/481 257/774 |

* cited by examiner

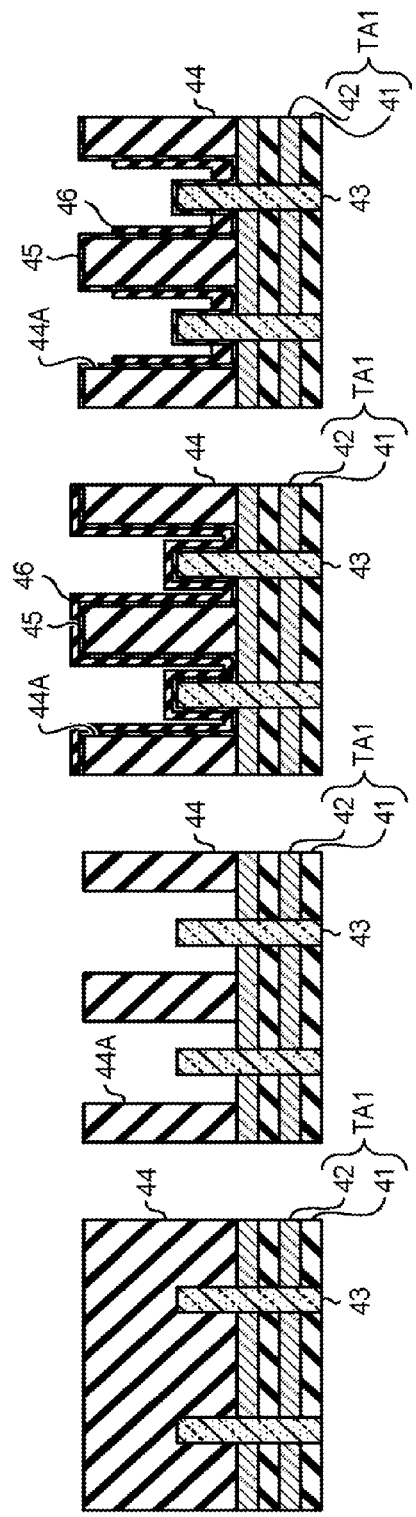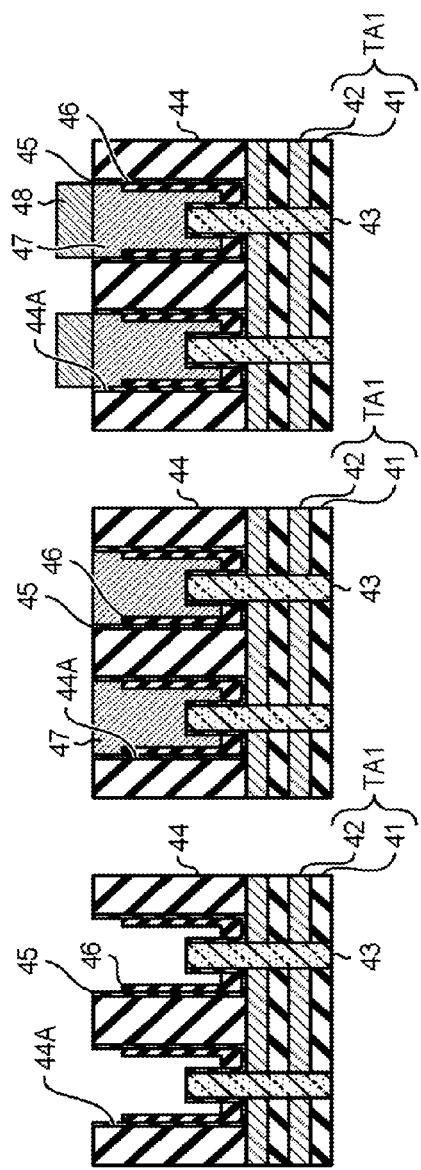

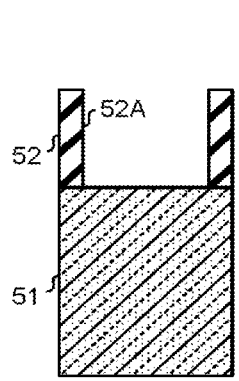 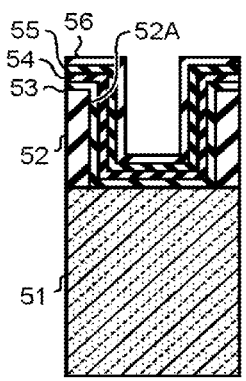 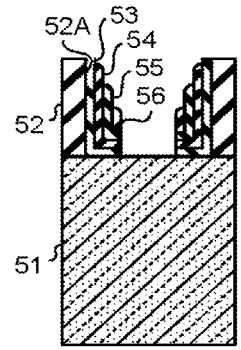 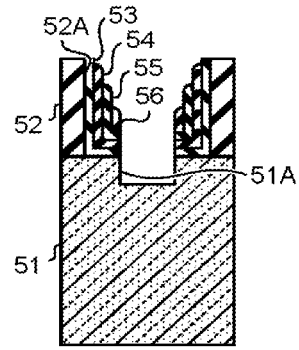
FIG.4A  FIG.4B  FIG.4C  FIG.4D
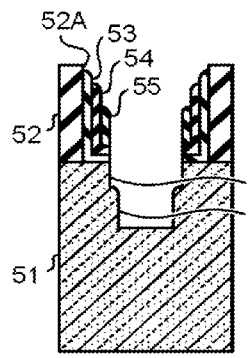 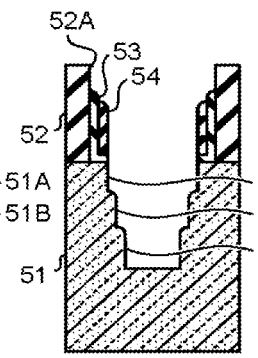 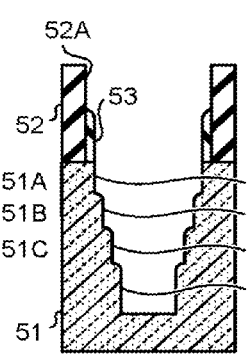 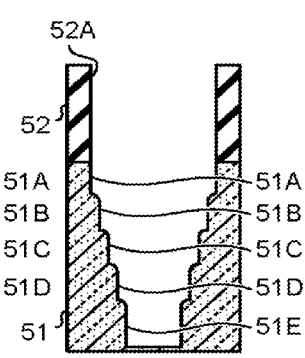
FIG.4E  FIG.4F  FIG.4G  FIG.4H

SEMICONDUCTOR DEVICE AND METHOD OF MANUFACTURING SEMICONDUCTOR DEVICE

CROSS-REFERENCE TO RELATED APPLICATIONS

This application is based upon and claims the benefit of priority front Japanese Patent Application No. 2015-52932, filed on Mar. 17, 2015; the entire contents of which are incorporated herein by reference.

FIELD

Embodiments of the present invention described herein relate to a semiconductor device and a method of manufacturing a semiconductor device.

BACKGROUND

In order to form a multi-stepped structure, there is a method of repeatedly performing a lithography process and an etching process as many as the number of steps. In order to form the multi-stepped structure, there is method of repeatedly perform a slimming process and an etching process of a resist layer as many as the number of steps.

BRIEF DESCRIPTION OF THE DRAWINGS

FIGS. 2A to 2G are cross-sectional diagrams illustrating a method of manufacturing a semiconductor device according to a second embodiment;

FIGS. 4A to 4H are cross-sectional diagrams illustrating a method of manufacturing a semiconductor device according to a fourth embodiment;

DETAILED DESCRIPTION

According to an embodiment, a spacer film having an etching resistance lower than that of an insulating layer is provided in a side wall of an opening of the insulating layer in a stepped shape.

Hereinafter, a semiconductor device and a method of manufacturing the semiconductor device according to embodiments will be described in detail with reference to the accompanied drawings. Further, the invention is not limited to these embodiments.

First Embodiment

FIGS. 1A to 1G are cross-sectional diagrams illustrating a method of manufacturing a semiconductor device according to a first embodiment.

Figure 1A:
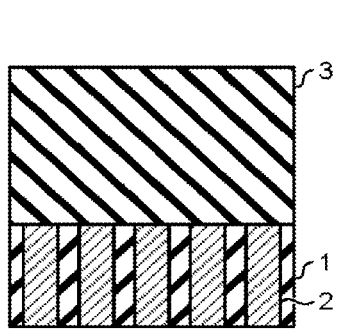
FIGS. 1A to 1G are cross-sectional diagrams illustrating a method of manufacturing a semiconductor device according to a first embodiment.

In FIG. 1A, a lower layer wiring 2 is buried in an insulating layer 1. Then, an insulating layer 3 is formed on the lower layer wiring 2 using a method such as a CVD. The material of the insulating layers 1 and 3, for example, may be $SiO_2$. The material of the lower layer wiring 2, for example, may be an impurity-doped polycrystalline silicon, or may be metal such as Al, Cu, or W.

Figure 1B:
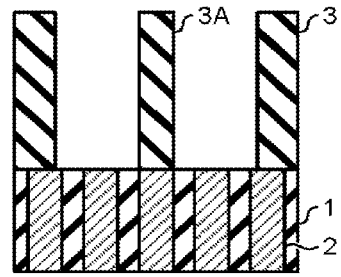

Next, as illustrated in FIG. 1B, an opening 3A is formed in the insulating layer 3 using a photolithography technique and an etching technique. At this time, the lower layer wiring 2 can be exposed from the insulating layer 3 through the opening 3A.

Figure 1C:
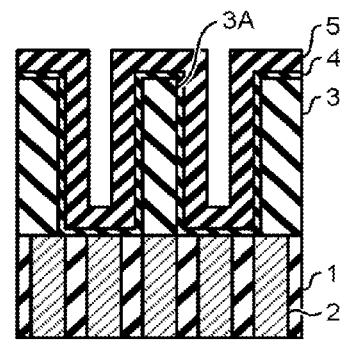

Next, as illustrated in FIG. 1C, spacer films 4 and 5 are sequentially formed on the insulating layer 3 to cover the inner surface of the opening 3A by a method such as the CVD. Herein, the spacer film 4 can be made to have an etching resistance higher than the spacer film 5. At this time, the material of the spacer film 4, for example, may be $Al_2O_3$ or SiN, and the material of the spacer film 5, for example, may be $SiO_2$. As the material of the spacer film 4, for example, $SiO_2$ may be used, and as the material of the spacer film 5, for example, amorphous silicon or polycrystalline silicon may be used.

Figure 1D:
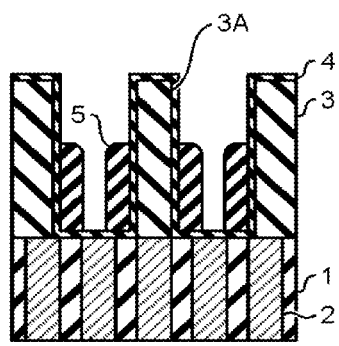

Next, as illustrated in FIG. 1D, the spacer film 5 is formed thin by an anisotropic etching, so that the spacer film 5 of a top surface and a bottom surface of the opening 3A is exposed while keeping the spacer film 5 in a stepped shape in a side wall of the spacer film 4. Herein, for example, in, a case where the spacer film 4 is made of $Al_2O_3$ and the spacer film 5 is made of $SiO_2$, a CF-based gas may be used as an etching gas of the spacer film 5. The CF-based gas, for example, may be selected among $CF_4$, $CHF_3$, $CH_2F_2$, $CH_3F_4$, $C_4F_8$ and $C_4F_6$.

Figure 1E:
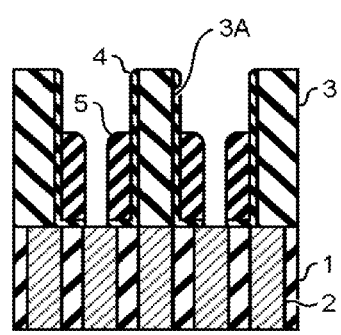

Next, as illustrated in FIG. 1E, the lower layer wiring 2 is exposed by forming the spacer film 4 thin through the anisotropic etching. At this time, it is possible to keep the stepped shape of the spacer film 5 of the side wall of the spacer film 4. Herein, for example, in a case where the spacer film 4 is made of $Al_2O_3$ and the spacer film 5 is made of $SiO_2$, a Cl-based gas may be used as an etching gas of the spacer film 4. The Cl-based gas, for example, may be selected from $Cl_2$ and $BCl_3$.

Figure 1F:
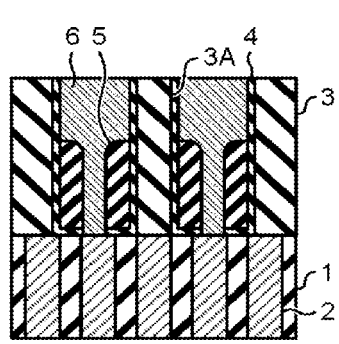
Figure 1G:
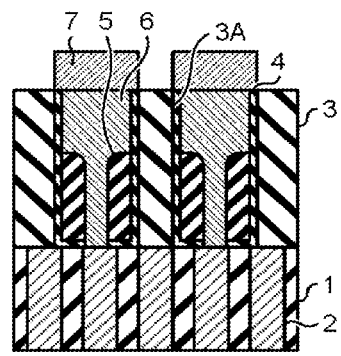

Next, as illustrated in FIG. 1F, a conductive material is deposited on the insulating layer 3 to fill the opening 3A through a sputtering method. Then, the conductive material is made thin until the surface of the insulating layer 3 is exposed through a CMP, that a contact plug 6 is formed in the opening 3A. Next, as illustrated in FIG. 1G, an upper layer wiring 7 is formed on the contact plug 6. The material of the contact plug 6 and the upper layer wiring 7, for example, may be an impurity-doped polycrystalline silicon, or may be metal such as Al, Cu, and W.

Herein, it is possible to make a dimension of a top surface of the contact plug 6 increased larger than a bottom surface thereof by providing the spacer film 5 in the stepped shape in the opening 3A. Therefore, even in a case where a positional deviation occurs in the opening 3A, it is possible to prevent a short circuit with respect to the lower layer wiring 2 through the contact plug 6. Further, even in a case where a positional deviation occurs in the upper layer wiring 7, it is possible to prevent that the contact plug 6 becomes an open circuit with respect to the upper layer wiring 7.

In addition, it is possible to form the spacer film 5 in the stepped shape through the etching of the spacer film 5 by making the etching resistance of the spacer film 4 higher than that of the spacer film 5. Therefore, since the spacer film 5 is formed in the stepped shape, the positional deviation caused by a misalignment with respect to the opening 3A is prevented, so that it is possible to improve a dimension precision in the stepped shape of the spacer film 5. In addition, since the spacer film 5 is formed in the stepped shape, there is no need to repeatedly perform a lithography process or a slimming process of a resist layer, so that it is possible to reduce the number of processes.

Furthermore, the spacer film 5 can be made of the same material as that of the insulating layer 3 by providing the spacer film 4 between the insulating layer 3 and the spacer film 5. For example, the insulating layer 3 and the spacer film 5 can be made of $SiO_2$.

Further, in the above-mentioned embodiment, the method of increasing the dimension of the top surface of the contact plug 6 larger than that of the bottom surface has been given as an example. However, the dimension of the top surface of the wiring may be applied to a method of making the dimension of the top surface of the wiring larger than that of the bottom surface.

In addition, in the above-mentioned embodiment, the description has been made about an example in which the spacer film 4 is provided between the insulating layer 3 and the spacer film 5. However, the spacer film 4 may be not provided. In this case, the insulating layer 3 is formed to have an etching resistance higher than that of the spacer film 5. At this time, the material of the insulating layer 3, for example, may be $Al_2O_3$, and the material of the spacer film 5, for example, may be $SiO_2$. In a case where $SiO_2$ is used as the material of the insulating layer 3, an organic film such as polyimide may be used as the material of the spacer film 5 for example.

Second Embodiment

FIGS. 2A to 2G are cross-sectional diagrams illustrating a method of manufacturing a semiconductor device according to a second embodiment. Further, in this embodiment, a NAND flash memory in which memory cells are three-dimensionally disposed will be given as an example of the semiconductor device.

In FIG. 2A, a conductive layer 41 and an insulating layer 42 are alternately stacked in a stacked body TA1. Further, the conductive layer 41 may be used as a word line. In the stacked body TA1, a columnar body 43 is buried therein to pass through the stacked body TA1 in the depth direction. At this time, the columnar body 43 can be formed to protrude onto the stacked body TA1. Then, an insulating layer 44 is formed on the stacked body TA1 by a method such as the CVD. The material of the insulating layers 42 and 44, for example, may be $SiO_2$. The material of the conductive layer 41, for example, may be the impurity-doped polycrystalline silicon, or may be metal such as Al, Cu, and W. The columnar body 43 may be formed using a stack structure in which a semiconductor, a tunnel insulating layer, a charge trap layer, and a block insulating layer are sequentially stacked in a cylindrical surface.

Next, as illustrated in FIG. 2S, an opening 44A is formed in the insulating layer 44 by using the photolithography technique and the etching technique. At this time, the columnar body 43 can be exposed from the insulating layer 44 through the opening 44A.

Next, as illustrated in FIG. 2C, spacer films 45 and 46 are sequentially formed on the insulating layer 44 to make the inner surface of the opening 44A covered by a method such as the CVD. Herein, the spacer film 45 can be formed to have an etching resistance higher than that of the spacer film 46. At this time, the material of the spacer film 45, for example, may be $Al_2O_3$ or SiN, and the material of the spacer film 46, for example, may be $SiO_2$.

Next, as illustrated in FIG. 2D, the spacer film 46 is formed thin through the anisotropic etching, so that the spacer film 45 in a top surface of the opening 44A and in a top surface of the columnar body 43 is exposed while keeping the spacer film 46 in the stepped shape in a side wall of the spacer film 45.

Next, as illustrated in FIG. 2E, the spacer film 45 is formed thin through the anisotropic etching, so that the columnar body 43 is exposed. At this time, it is possible to keep the stepped shape of the spacer film 46 in the side wall of the spacer film 45.

Next, as illustrated in FIG. 2F, a conductive material is deposited on the insulating layer 44 to fill the opening 44A through a sputtering method. Then, the conductive material is made thin until the surface of the insulating layer 44 is exposed through a CMP, so that a contact plug 47 is formed in the opening 44A. Next, as illustrated in FIG. 2G, a bit line 48 is formed on the contact plug 47. The material of the contact plug 47 and the bit line 48, for example, may be the impurity-doped polycrystalline silicon, or may be metal such as Al, Cu, and W.

Herein, it is possible to make a dimension of a top surface of the contact plug 47 increased larger than a bottom surface thereof by providing the spacer film 46 in the stepped shape in the opening 44A. Therefore, even in a case where a positional deviation occurs in the opening 44A, it is possible to prevent a short circuit with respect to the columnar body 43 through the contact plug 47. Further, even in a case where a positional deviation occurs in the bit line 48, it is possible to prevent that the contact plug 47 becomes an open circuit with respect to the bit line 48.

In addition, it is possible to form the spacer film 46 in the stepped shape through the etching of the spacer film 46 by making the etching resistance of the spacer film 45 higher than that of the spacer film 46. Therefore, since the spacer film 46 is formed in the stepped shape, the positional deviation caused by a misalignment with respect to the opening 44A is prevented, so that it is possible to improve a dimension precision in the stepped shape of the spacer film 46. In addition, since the spacer film 46 is formed in the stepped shape, there is no need to repeatedly perform a lithography process or a slimming process of a resist layer, so that it is possible to reduce the number of processes.

Furthermore, the spacer film 46 can be made of the same material as that of the insulating layer 44 by providing the spacer film 45 between the insulating layer 44 and the spacer film 46. For example, the insulating layer 44 and the spacer film 46 can be made of $SiO_2$.

Third Embodiment

Figure 3:
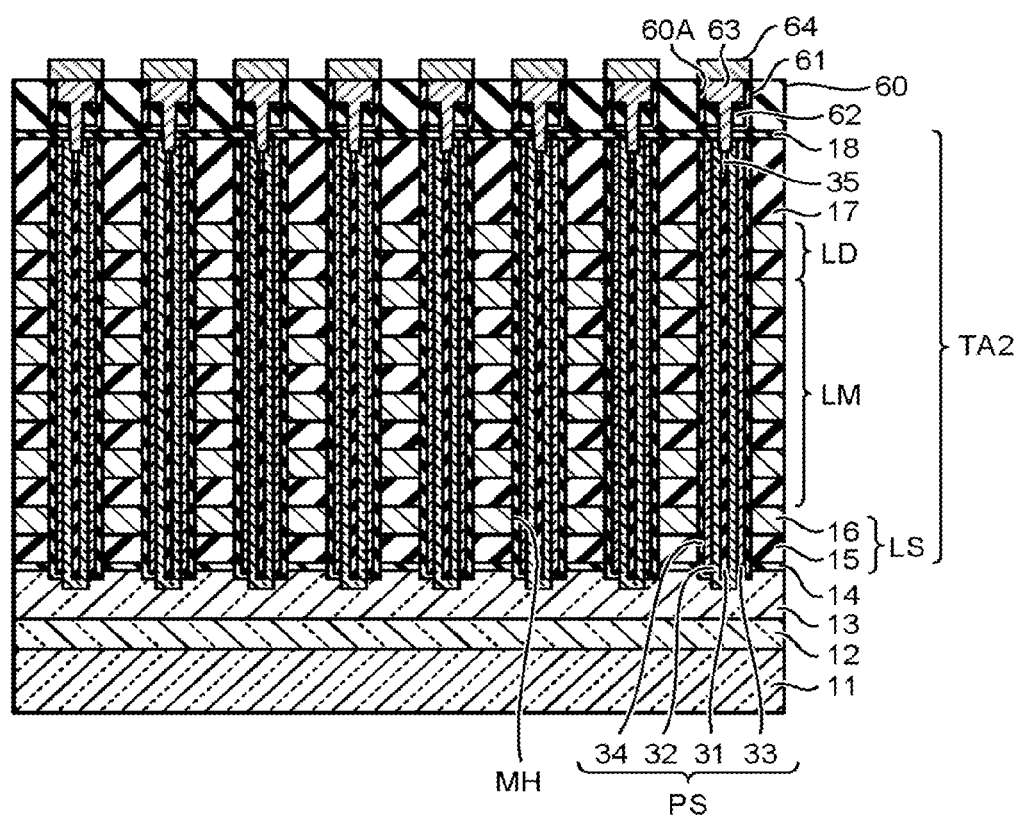
FIG. 3 is a cross-sectional diagram illustrating a schematic configuration of a semiconductor device according to a third embodiment.

FIG. 3 is a cross-sectional diagram illustrating a schematic configuration of a semiconductor device according to a third embodiment. Further, in this embodiment, a NAND flash memory in which memory cells are three-dimensionally disposed will be given as an example of the semiconductor device.

In FIG. 3, an N well 12 is provided in a semiconductor substrate 11, and a P well 13 is provided in the N well 12.

An insulating film 14 is formed on the P well 13, and a stacked body TA2 is formed on the insulating film 14. In the stacked body TA2, an interlayer insulating film 15 and a conductive film 16 are alternately stacked. In FIG. 3, there is exemplified an example in which the interlayer insulating film 15 and the conductive film 16 are alternately stacked only by 6 layers. An insulating film 17 is formed on the conductive film 16 of the uppermost layer. Further, the material of the semiconductor substrate 11, for example, may be a semiconductor such as Si, SiGe, and SiC. The material of the insulating films 14 and 17 and the material of the interlayer insulating film 15, for example, may be $SiO_2$. The material of the conductive film 16, for example, may be the impurity-doped polycrystalline silicon, or may be metal such as W. Herein, in the stacked body TA2, a memory cell array layer LM and select transistor layers LS and LD can be provided. The select transistor layer LS may be provided below the memory cell array layer LM, and the select transistor layer LD may be provided on the memory cell array layer LM. At this time, the conductive film 16 of the first layer is assigned to the select transistor layer LS, and can be used as a select gate line on a side near the source. The conductive films 16 from the second layer to the fifth layer are assigned to the memory cell array layers LM, and can be used as word lines. The conductive film 16 of the sixth layer is assigned to the select transistor layer LD, and can be used as a select gate line on a side near the drain.

In addition, a memory hole MH is formed in the stacked body TA2 in the depth direction. The memory hole MH passes through the stacked body TA2, and reaches the P well 13. A columnar body PS is buried in the memory hole MH. Herein, a columnar insulating body 31 is formed in the center of the columnar body PS, and a columnar semiconductor 35 is formed on the columnar insulating body 31. Semiconductor films 32 and 33 are formed between the inner surface of the memory hole MH and the columnar insulating body 31, and an insulating film 34 is formed between the inner surface of the memory hole MH and the semiconductor film 33. At this time, the semiconductor films 32 and 33 may be formed even in the surrounding of the columnar semiconductor 35. Herein, it is possible to be configured such that the semiconductor film 32 abuts on the P well 13 and the columnar semiconductor 35, and the semiconductor film 33 does not abut on the P well 13 and the columnar semiconductor 35. At this time, the semiconductor film 32 may serve as a channel layer, and the semiconductor film 33 may serve as a body layer. In the insulating film 34, the tunnel insulating layer, the charge trap layer, and the block insulating layer may be provided. Further, the semiconductor films 32 and 33 and the columnar semiconductor 35, for example, may be made of a P-type amorphous silicon. The tunnel insulating layer and the block insulating layer, for example, may be made of a silicon oxide film. The charge trap layer, for example, may be made of a silicon nitride film, or may be made of an ONO film (a three-layer structure of the silicon oxide film/the silicon nitride film/the silicon oxide film), or may be made of an ONOS film (a four-layer structure of the silicon oxide film/the silicon nitride film/the silicon oxide film/a silicon oxynitride film).

An insulating film 18 is formed on the stacked body TA2, and an insulating layer 60 is formed on the insulating film 18. An opening 60A is formed in the insulating layer 60. A spacer film 61 is formed in a side wall of the opening 60A, and a spacer film 62 is formed in the stepped shape in a side wall of the spacer film 61. Then, in the opening 60A, a contact plug 63 is buried therein to be connected to the columnar semiconductor 35. A bit line 64 is formed on the contact plug 63. Herein, the spacer film 61 can be made to have an etching resistance higher than that of the spacer film 62. At this time, the material of the spacer film 61, for example, may be $Al_2O_3$, and the material of the insulating film 18, the insulating layer 60, and the spacer film 62, for example, may be $SiO_2$. The material of the contact plug 63 and the bit line 64, for example, may be the impurity-doped polycrystalline silicon, or may be metal such as Al, Cu, and W.

Fourth Embodiment

FIGS. 4A to 4H are cross-sectional diagrams illustrating a method of manufacturing a semiconductor device according to a fourth embodiment.

In FIG. 4A, a stepped structure 52 is formed on an underlying layer 51 by a method such as the CVD. A stepped surface 52A is provided in the stepped structure 52. The underlying layer 51 may be the semiconductor substrate, or may be an insulating body, or may be the impurity-doped polycrystalline silicon, or may be a multi-layer wiring layer. The material of the stepped structure 52, for example, may be $SiO_2$, or may be the impurity-doped polycrystalline silicon.

Next, as illustrated in FIG. 4B, spacer films 53 to 56 are sequentially formed on the stepped structure 52 by a method such as the CVD such that the stepped surface 52A is sequentially covered. Herein, the spacer films 53 to 56 may be formed to have the etching resistances sequentially increased as it goes front the upper layer toward the lower layer. At this time, the material of the spacer films 53 to 56 may be polycrystalline silicon (or amorphous silicon) having a different impurity concentration or a different impurity type at every layer. For example, a combination of a P (phosphorus)-doped polycrystalline silicon, a non-doped polycrystalline silicon, and a B (boron)-doped polycrystalline silicon may be used. At this time, etching rates are set to satisfy the P-doped polycrystalline silicon>the non-doped polycrystalline silicon>the B-doped polycrystalline silicon. In addition, the etching rate of the P-doped polycrystalline silicon can be increased by increasing a P concentration. The etching rate of the B-doped polycrystalline silicon can be reduced by increasing a B concentration.

Next, as illustrated in FIG. 4C, the spacer films 53 to 56 are formed thin by the anisotropic etching, so that the underlying layer 51 is exposed while keeping the spacer films 53 to 56 in the stepped shape.

Next, as illustrated in FIG. 4D, the underlying layer 51 is etched using the stepped structure 52 and the spacer films 53 to 56 as masks, so that a step 51A is formed in the underlying layer 51.

Next, as illustrated in FIG. 4E, a step 51B is formed inside the step 51A by etching the underlying layer 51 until the spacer film 56 is eliminated. At this time, since the spacer films 53 to 55 have the etching resistance higher than the spacer film 56, the spacer films 53 to 55 may be left in the stepped surface 52A even in a case where the spacer film 56 is eliminated.

Next, as illustrated in FIG. 4F, a step 51C is formed inside the step 51B by etching the underlying layer 51 until the spacer film 55 is eliminated. At this time, since the spacer films 53 and 54 have the etching resistance higher than the spacer film 55, the spacer films 53 and 54 can be left in the stepped surface 52A even in a case where the spacer film 55 is eliminated.

Next, as illustrated in FIG. 4G, a step 51D is inside the step 51C by etching the underlying layer 51 until the spacer film 54 is eliminated. At this time, since the spacer film 53 has the etching resistance higher than the spacer film 54, the spacer film 53 can be left in the stepped surface 52A even in a case where the spacer film 54 is eliminated.

Next, as illustrated in FIG. 4H, a step 51E is formed inside the step 51D by etching the underlying layer 51 until the spacer film 53 is eliminated.

Herein, since the etching resistances of the spacer films 53 to 56 become sequentially higher as it goes from the upper layer toward the lower layer, the steps 51A to 51E can be formed in the underlying layer 51 by simultaneously etching the spacer films 53 to 56 and the underlying layer 51. Therefore, since the steps 51A to 51E are formed in the underlying layer 51, the positional deviation caused by the misalignment between the spacer films 53 to 56 disappears, so that it is possible to improve a dimension precision of the steps 51A to 51E of the underlying layer 51. In addition, since the steps 51A to 51E are formed in the underlying layer 51, there is no need to repeatedly perform the lithography process or the slimming process of the resist layer, so that it is possible to reduce the number of processes.

Fifth Embodiment

FIGS. 5A to 5F are cross-sectional diagrams illustrating a method of manufacturing a semiconductor device according to a fifth embodiment.

In this embodiment, the semiconductor device is manufactured such that the spacer films 53 to 56 are different in film thickness. For example, in the procedure of FIG. 5S, the film thickness of the spacer film 55 is set to T1, and the film thickness of the spacer films 53, 54, and 56 is set to T2 (T1>T2).

Then, as illustrated in FIG. 5S, a step 51A' is formed in the underlying layer 51 by etching the underlying layer 51 using the stepped structure 52 and the spacer films 53 to 56 as masks.

Figure 5A:
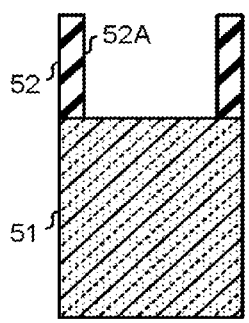
FIGS. 5A to 5F are cross-sectional diagrams illustrating a method of manufacturing a semiconductor device according to a fifth embodiment.
Figure 5B:
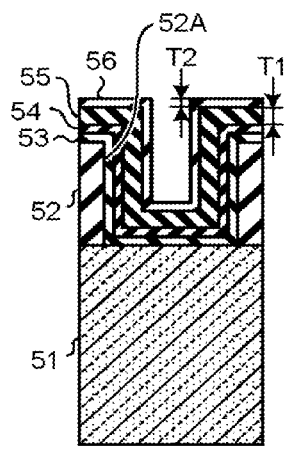
Figure 5C:
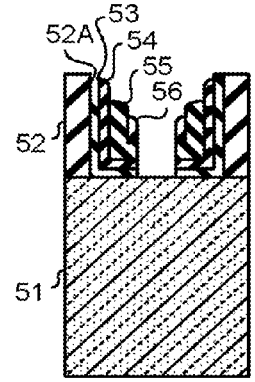
Figure 5D:
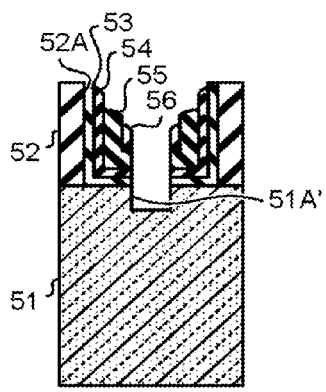
Figure 5E:
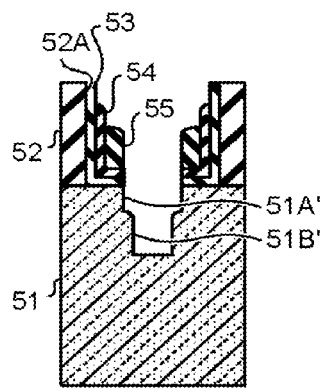

Next, as illustrated in FIG. 5E, a step 51B' is formed inside the step 51A' by etching the underlying layer 51 until the spacer film 56 is eliminated.

Figure 5F:
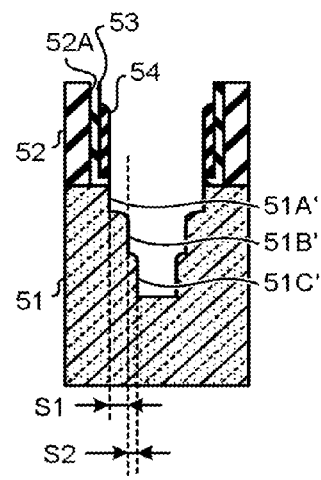

Next, as illustrated in FIG. 5F, a step 51C' is formed inside the step 51B' by etching the underlying layer 51 until the spacer film 55 is eliminated. Herein, a width S1 of the step 51B' can be set with respect to the film thickness T1 of the spacer film 55, and a width S2 of the step 51C' can be set with respect to the film thickness T2 of the spacer film 56. Therefore, it is possible to make the widths of the steps of the underlying layer 51 different by making the film thickness between the spacer films 53 to 56 different.

Sixth Embodiment

FIGS. 6A, 6B, 7A, 7B, 8A, and 8B are cross-sectional diagrams illustrating a method of manufacturing a semiconductor device according to a sixth embodiment. Further, in this embodiment, a NAND flash memory in which memory cells are three-dimensionally disposed will be given as an example of the semiconductor device.

Figure 6B:
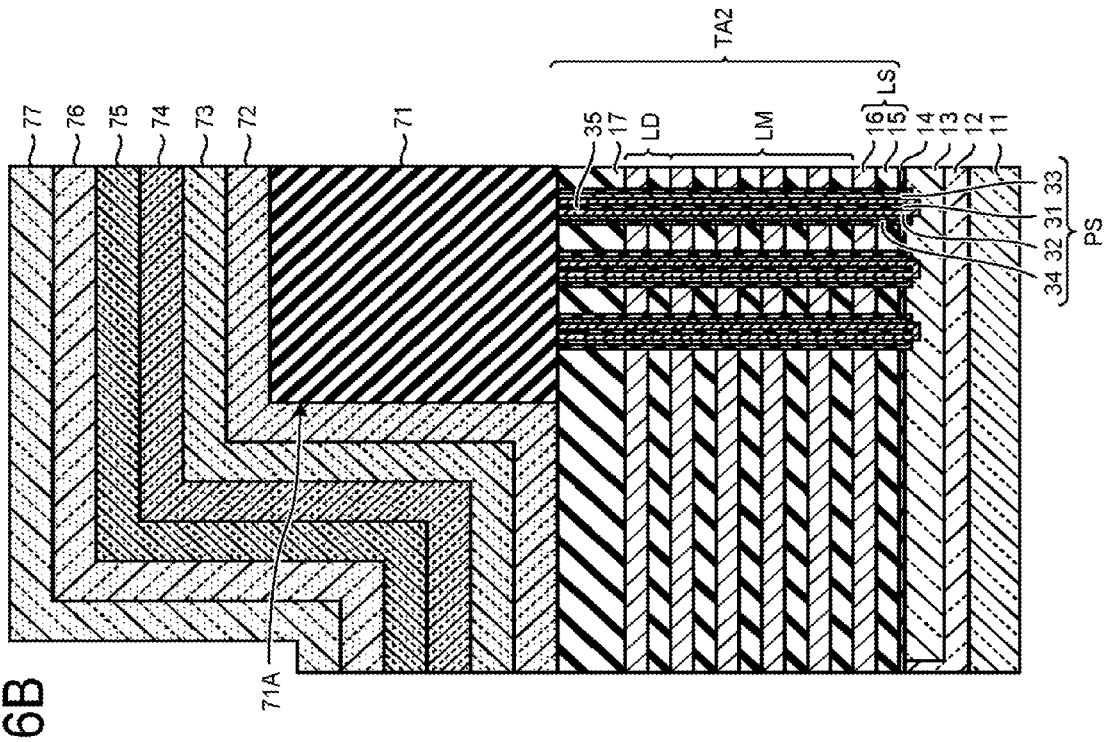
FIGS. 6A and 6B are cross-sectional diagrams illustrating a method of manufacturing a semiconductor device according to a sixth embodiment.
Figure 6A:
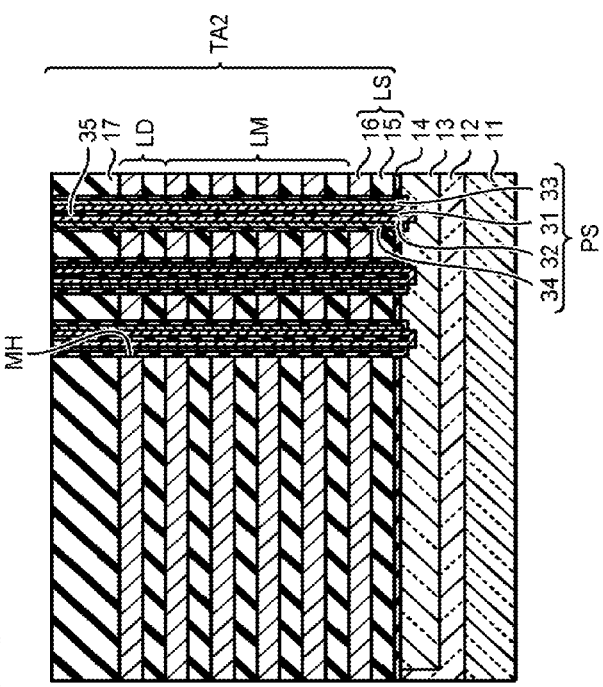

In FIG. 6A, the N well 12 is provided in the semiconductor substrate 11, and the P well 13 is provided in the N well 12. The insulating film 14 is formed on the P well 13, and the stacked body TA2 is formed on the insulating film 14. In the stacked body TA2, the interlayer insulating film 15 and the conductive film 16 are alternately stacked. The insulating film 17 is formed on the uppermost conductive film 16. The memory hole MH is formed in the stacked body TA2 in the depth direction. The memory hole MH passes through the stacked body TA2, and reaches the P well 13. The columnar body PS is buried in the memory hole MH. Herein, the columnar insulating body 31 is formed in the center of the columnar body PS, and the columnar semiconductor 35 is formed on the columnar insulating body 31. The semiconductor films 32 and 33 are formed between the inner surface of the memory hole MH and the columnar insulating body 31, and the insulating film 34 is formed between the inner surface of the memory hole MH and the semiconductor film 33.

Then, as illustrated in FIG. 6B, a stepped structure 71 is formed on the stacked body TA2 by a method such as the CVD. A stepped surface 71A is provided in the stepped structure 71. The material of the stepped structure 71, for example, may be $SiO_2$, or may be polycrystalline silicon.

Next, as illustrated in FIG. 6B, spacer films 72 to 77 are sequentially formed on the stepped structure 71 by a method such as the CVD such that the stepped surface 71A is sequentially covered. Herein, the spacer films 72 to 77 may be formed to have the etching resistance sequentially increased as it goes from the upper layer toward the lower layer. At this time, the material of the spacer films 72 to 77 may be polycrystalline silicon (or amorphous silicon) having a different impurity concentration or a different impurity type at every layer. For example, a combination of a P (phosphorus)-doped polycrystalline silicon, a non-doped polycrystalline silicon, and a B (boron)-doped polycrystalline silicon may be used. At this time, etching rates are set to satisfy the P-doped polycrystalline silicon>the non-doped polycrystalline silicon>the B-doped polycrystalline silicon. In addition, the etching rate of the P-doped polycrystalline silicon can be increased by increasing a P concentration. The etching rate of the B-doped polycrystalline silicon can be reduced by increasing a B concentration.

Figure 7B:
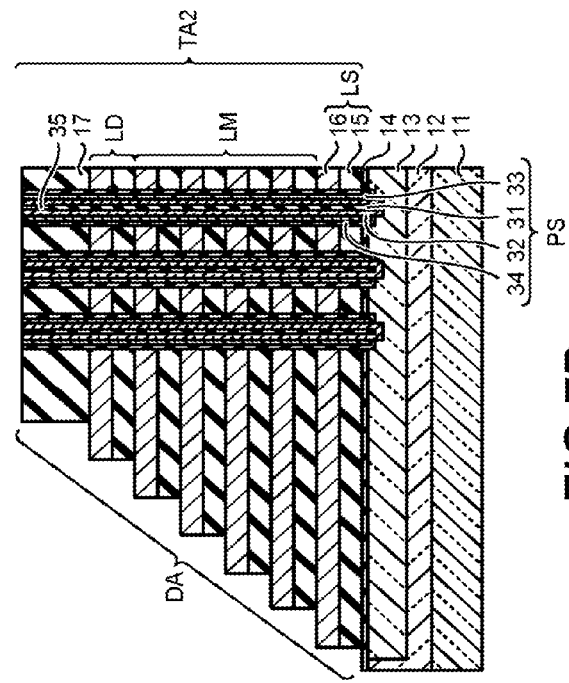
FIGS. 7A and 7B are cross-sectional diagrams illustrating a method of manufacturing the semiconductor device according to the sixth embodiment.
Figure 7A:
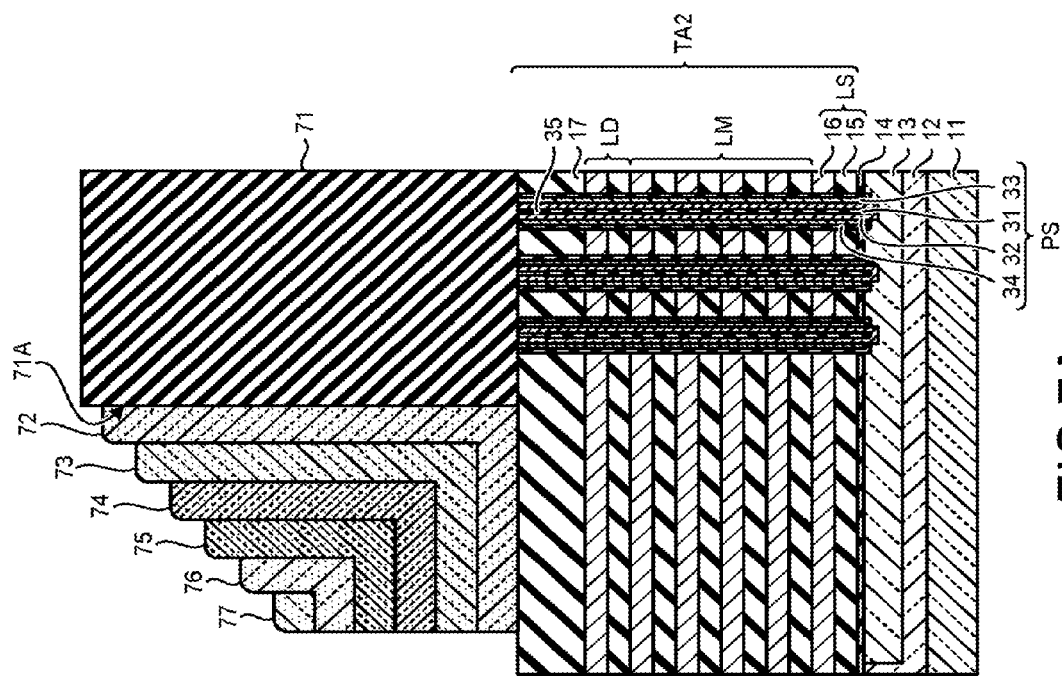

Next, as illustrated in FIG. 7A, the spacer films 72 to 77 formed thin by the anisotropic etching, so that the stacked body TA2 is exposed while keeping the spacer films 72 to 77 in the stepped shape.

Next, as illustrated in FIG. 7B, a step DA is formed in the stacked body TA2 by etching the stacked body TA2 using the stepped structure 71 and the spacer films 72 to 77 as masks. At this time, the step DA can be formed in the stacked body TA2 in the stepped shape such that the conductive film 16 and the interlayer insulating film 15 of the upper layer is retracted from the conductive film 16 and the interlayer insulating film 15 of the lower layer.

Figure 8A:
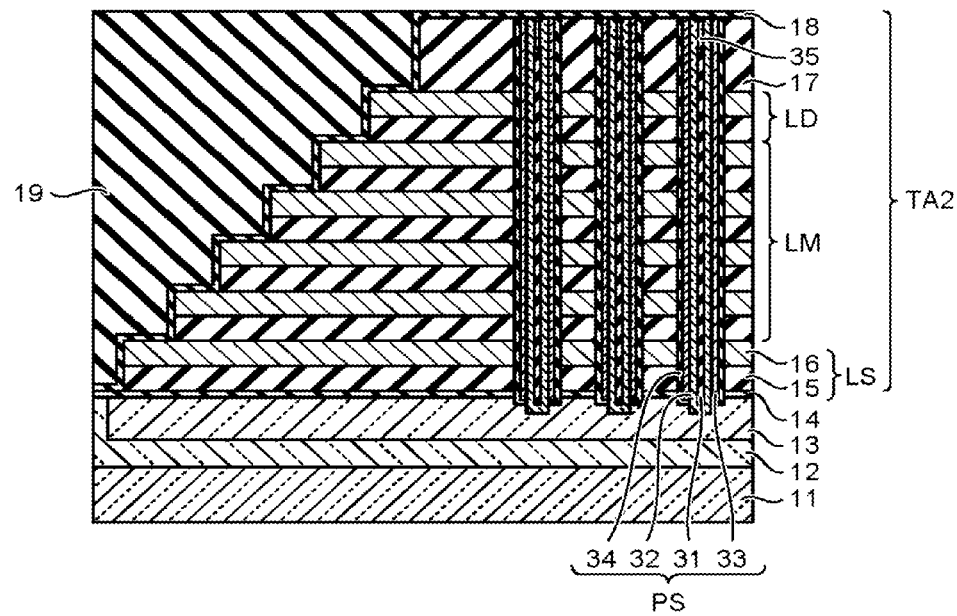
FIGS. 8A and 8B are cross-sectional diagrams illustrating a method of manufacturing the semiconductor device according to the sixth embodiment.

Next, as illustrated in FIG. 8A, an insulating film 19 is buried in a space on the step DA to make the step DA flat after the insulating film 18 is formed along the step DA. At this time, the insulating film 18 can be formed to have step coverage larger than the insulating film 19.

Figure 8B:
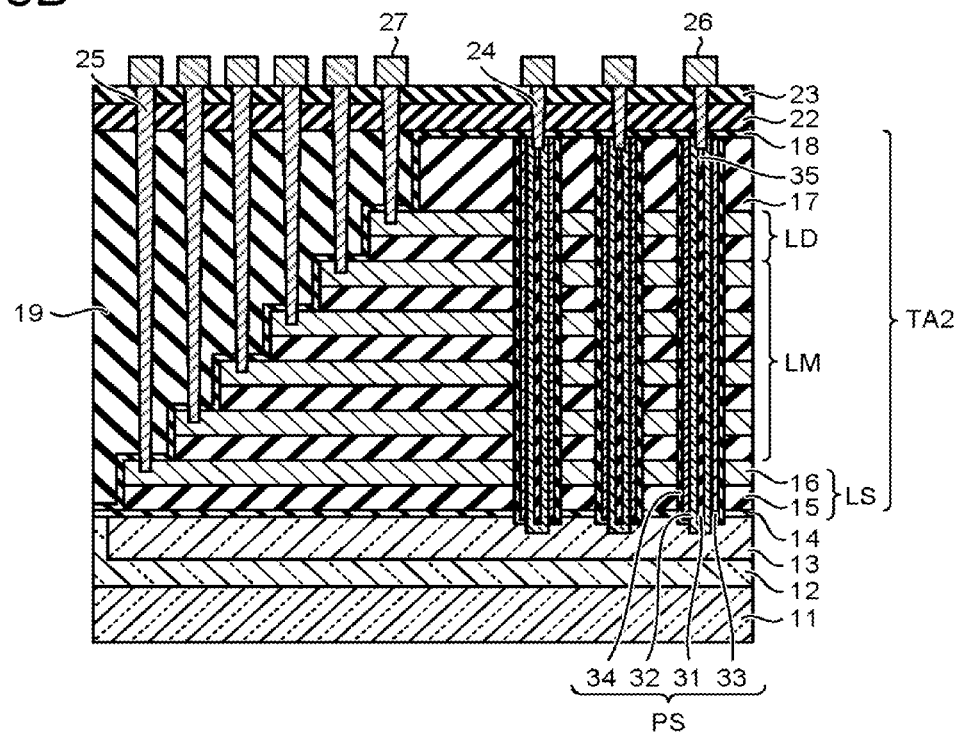

Next, as illustrated in FIG. 8B, an insulating film 22 is formed on the insulating films 18 and 19 by a method such as the CVD, and an insulating film 23 is formed on the insulating film 22. Then, a contact plug 24 abutting on the columnar semiconductor 35 is buried in the insulating films 22 and 23. Furthermore, a contact plug 25 is buried in the insulating films 19, 22, and 23 to abut on each conductive film 16. Then, a bit line 26 connected to on the contact plug 24 is formed on the insulating film 23, and a wiring 27 connected to the contact plug 25 is formed on the insulating film 23.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   an insulating layer provided on a semiconductor substrate;
   an opening provided on the insulating layer;
   a spacer film provided in a side wall of the opening in a stepped shape, a material of the spacer film being different from that of the insulating layer;
   a conductive body provided in the opening to be configured to cover the spacer film, wherein a height of the spacer film is lower than that of the insulating layer, and
   an insulating film provided between the side wall of the opening and the spacer film, and extending under a bottom of the spacer film wherein a height of the spacer film is lower than that of the insulating film.

2. The semiconductor device of claim 1,
   wherein a top surface of the conductive body is formed to have a dimension larger than that of a bottom surface.

3. The semiconductor device of claim 2, further comprising:
   a lower layer wiring connected to the bottom surface of the conductive body; and
   an upper layer wiring connected to the top surface of the conductive body.

4. The semiconductor device of claim 3,
   wherein the spacer film is an insulating body.

5. The semiconductor device of claim 3,
   wherein the conductive body is a contact plug.

6. The semiconductor device of claim 1,
   wherein the conductive body is a wiring.

7. A semiconductor device comprising:
   an insulating layer provided on a semiconductor substrate;
   an opening provided in the insulating layer;
   a first spacer film provided in a side wall of the opening, a material of the first spacer film being different from that of the insulating layer;
   a second spacer film provided in a side wall of the first spacer film in a stepped shape, a material of the second spacer film being different from that of the first spacer film; and
   a conductive body provided in the opening to be configured to cover the second spacer film, wherein a height of the second spacer film is lower than that of the first spacer film.

8. The semiconductor device of claim 7,
   wherein the insulating layer and the second spacer film are made of the same material.

9. The semiconductor device of claim 8,
   wherein the first spacer film is an insulating body.

10. The semiconductor device of claim 9,
    wherein the insulating layer and the second spacer film are made of $SiO_2$, and the first spacer film is made of $Al_2O_3$.

11. The semiconductor device of claim 7,
    wherein a top surface of the conductive body is formed to have a dimension larger than that of a bottom surface.

12. The semiconductor device of claim 11, further comprising:
    a lower layer wiring connected to the bottom surface of the conductive body; and
    an upper layer wiring connected to the top surface of the conductive body.

13. The semiconductor device of claim 12,
    wherein the conductive body is a contact plug.

14. The semiconductor device of claim 7,
    wherein the conductive body is a wiring.

15. The semiconductor device of claim 7, wherein the first spacer film extends under a bottom of the second spacer film.

* * * * *